United States Patent
Wolf et al.

(10) Patent No.: US 6,920,174 B1
(45) Date of Patent: Jul. 19, 2005

(54) METHOD FOR MEASURING AND EVALUATING MULTI-CARRIER SIGNALS

(75) Inventors: Peter Wolf, Munich (DE); Christoph Balz, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/744,218

(22) PCT Filed: Oct. 21, 1999

(86) PCT No.: PCT/EP99/08006

§ 371 (c)(1),
(2), (4) Date: Jan. 22, 2001

(87) PCT Pub. No.: WO00/28711

PCT Pub. Date: May 18, 2000

(30) Foreign Application Priority Data

Nov. 5, 1998 (DE) .......................... 198 51 093

(51) Int. Cl.$^7$ .............................................. H04L 17/00
(52) U.S. Cl. ...................................................... 375/228
(58) Field of Search ................................. 375/260, 261, 375/279, 280, 316, 329, 332, 340, 224, 228; 370/206, 208, 210, 207; 324/76.19, 76.22; 702/67, 71, 75, 76, 66; 348/180, 186

(56) References Cited

U.S. PATENT DOCUMENTS

| | | | | |
|---|---|---|---|---|
| 4,627,071 A | * | 12/1986 | Head et al. .................. | 714/704 |
| 4,639,934 A | * | 1/1987 | Zuranski et al. ............ | 375/226 |
| 4,818,931 A | | 4/1989 | Naegeli et al. | |
| 5,629,957 A | | 5/1997 | Murata | |
| 6,741,642 B1 | * | 5/2004 | Bernard et al. .............. | 375/228 |

FOREIGN PATENT DOCUMENTS

| DE | A1-19547896 | 7/1997 |
|---|---|---|
| EP | A2781014 | 6/1997 |

* cited by examiner

Primary Examiner—Tesfaldet Bocure
(74) Attorney, Agent, or Firm—Birch, Stewart, Kolasch & Birch, LLP

(57) ABSTRACT

For measuring and evaluating multi-carrier signals the I and/or Q components obtained by demodulation are integrated across several values and are graphically shown for every single carrier or combined carrier groups of the multi-carrier signal on the screen display unit. To this end, the individual carriers or carrier groups are applied side by side on the horizontal axis of a diagram and the I and/or Q components that pertain to the carriers or carrier groups are recorded along a vertical line.

5 Claims, 2 Drawing Sheets

16 QAM

METHOD FOR MEASURING AND EVALUATING MULTI-CARRIER SIGNALS

This application is the national phase under 35 U.S.C. § 371 of PCT International Application No. PCT/EP99/08006 which has an International filing date of Oct. 21, 1999, which designated the United States of America.

BACKGROUND OF THE INVENTION

1. Field of the Invention

The invention relates to a process for the metrological analysis of multicarrier signals.

2. Description of the Background Art

In OFDM (Orthogonal Frequency Division Multiplex) multicarrier systems used in modern transmission technology, far example in DAB (Digital Audio Broadcasting) and DVB-T (Digital Video Broadcasting, terrestrial), for a metrological analysis a graphic display enabling a user to detect system faults at a glance is desirable. Although it is known to graphically display the digital modulation of a single carrier on the screen of a display device with combined shift keying between amplitude- and/or phase states in the vector diagram (I/Q plane) (German OS 195 47 896), this facility provided for a single carrier is not effective for a multicarrier system comprising, for example, 1536 individual carriers in the case of DAB, or 1705 or 6817 individual carriers in the case of DVB because a selective assessment of the signal can be performed only in a very complicated manner in such cases.

SUMMARY OF THE INVENTION

Therefore the object of the invention is to provide a simple process with which the I/Q components of a OFD signal can be graphically displayed, separately for each individual carrier, for the metrological analysis.

In accordance with a preferred embodiment of the invention, the I-components and/or Q-components of a freely selectable number of symbols are acquired either individually or jointly and are then graphically displayed in a vertical line on the screen of a display device for each individual carrier of the multicarrier system. In this way, even in a multicarrier system of this type, an observer can immediately establish whether any symbols at all are being transmitted on one or more carriers. Thus, in the absence of I/Q values, a gap appears in the column in place of the relevant carrier. If disturbed symbols or no symbols at all but only noise is transmitted in the case of one or more carriers, this is visible in the form of a vertical, continuous line in the rows. The user thus obtains a simple graphic overview of the utilization of the value range of the I- and Q-components as a function of the frequency and in this way can metrologically analyze such an OFDM multicarrier system in a simple manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION OF THE PREFERRED EMBODIMENTS

In the following the invention will be explained in detail in the form of an exemplary embodiment for a multicarrier signal in the 8 k mode with 16-QAM modulation making reference to a schematic drawing.

Figure 1:
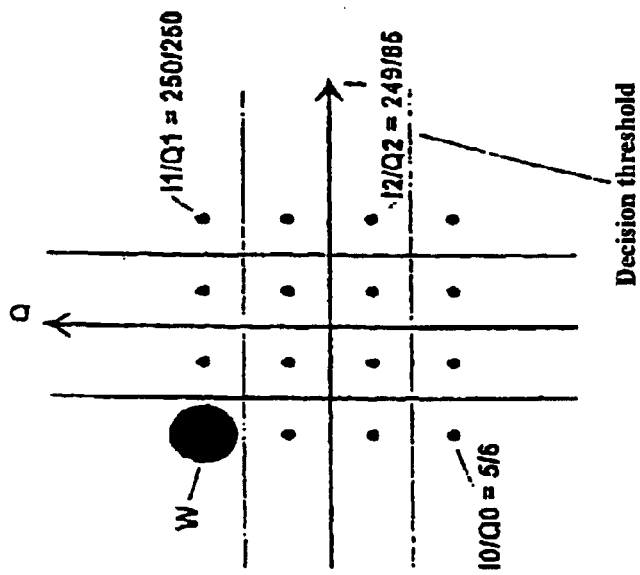
FIG. 1 is an illustration of a constellation diagram for a 16-QAM modulation.
Figure 2:
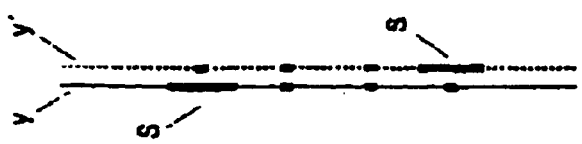
FIG. 2 is an illustration of individual modulation points.
Figure 3:
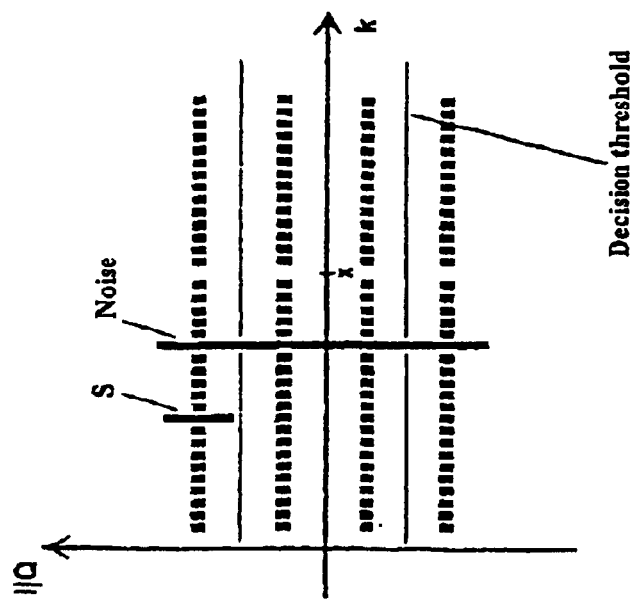
FIG. 3 is an illustration of relevant I- and Q-components projected onto a vertical line.

FIG. 1 illustrates a constellation diagram for a 16-QAM modulation. In a processor all these individual modulation points of the two-dimensional diagram are projected onto the ordinate y, as illustrated in FIG. 2. This is performed for each individual carrier of the multicarrier system whereupon, in accordance with FIG. 3, the relevant I- and Q-components projected onto a vertical line are displayed on the screen individually for each carrier. Points lying one above another and representing the I/Q value for each carrier thus appear horizontally in rows on the screen. If no symbol is transmitted on a carrier, this is represented for the relevant carrier by an absence of measurement points in the form of gaps, as illustrated in FIG. 3 for the carrier x. If one of the modulation points is disturbed due to a fault, as represented by the value spot W in FIG. 1, this manifests in the form of a vertical line S crossing the decision field for the relevant carrier. If only noise is transmitted via one of the carriers, this is represented by a continuous vertical line in the diagram in FIG. 3. The user thus has the possibility of metrologically analyzing the mode of operation of an OFDM multicarrier system.

The abscissa of the diagram in FIG. 3 is scaled with the numbers k of the individual carriers of the multicarrier system, thus from 0 to 6816 (8 k-mode) in the case of DVB-T with a total of 6817 carriers. In many cases such a large number of carriers cannot be displayed with adequate resolution on the screen of a display device. A screen commonly used in practice only permits a display over 320 columns, for example, in the horizontal direction. In these cases it is expedient for the entire carrier spectrum to be split into individual sections and for only the individual sections in each case to be displayed on the screen, or for the data of a plurality of carriers to be combined to form a group and for the data of this group to be displayed in a column on the screen.

If, in accordance with the exemplary embodiment, all the I- and Q-components are in each case projected onto a common line y, it is undetectable whether a determined disturbance originates from the I- or Q-value or from a combination of these two values. Therefore it is advantageous to provide a switch-over device with which optionally either only all the integrated I-components or only all the integrated Q-components or a combination of all the I-Q components can be displayed for each carrier. Another option includes, in each case, separately projecting the I- and Q-components onto closely adjacent vertical lines, these then also being shown separately for each carrier in the diagram according to FIG. 3. This is both effective and possible for multicarrier systems comprising for example only 100 carriers. The I-components are thus projected for example onto the line Y' shown as a broken line in FIG. 2, while the Q-components are projected onto the directly adjacent vertical line Y.

Figure 4:
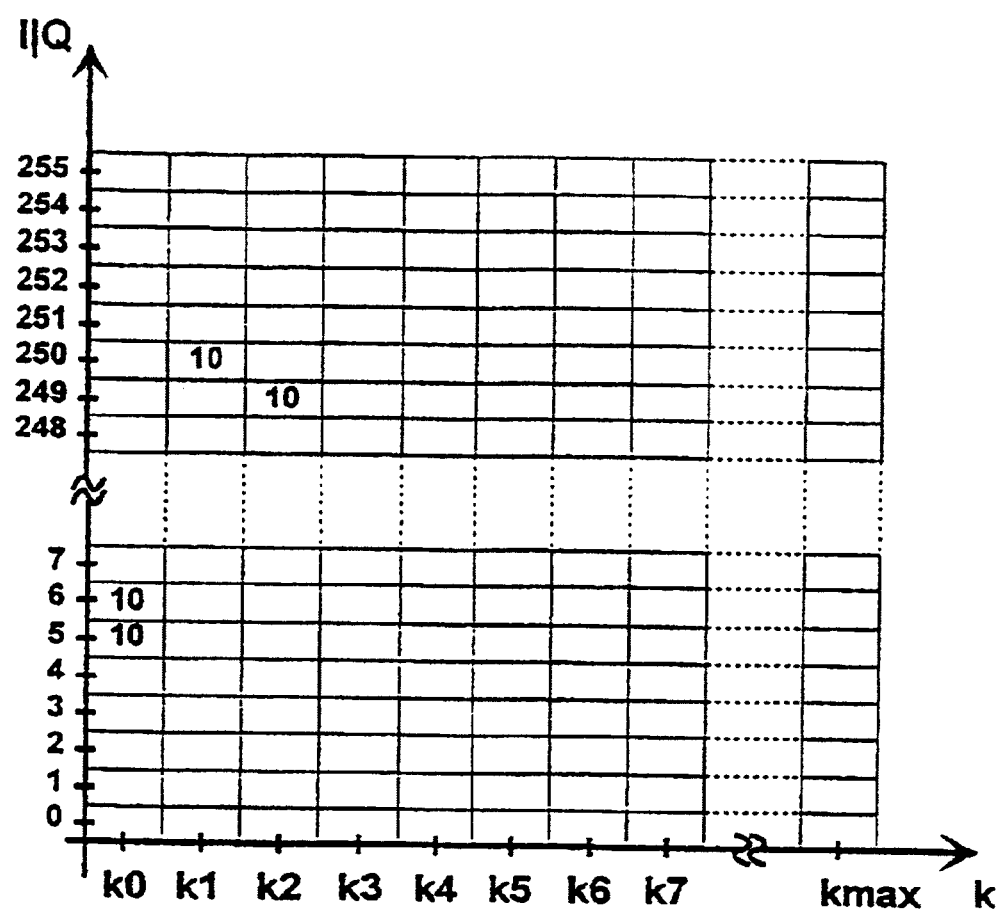
FIG. 4 is a graph showing an integration and line projection of the individual carriers for a single symbol.

FIG. 4 schematically illustrates an exemplary embodiment for the integration and line projection of the I- and Q-values of the individual carriers for a single symbol within an OFDM signal. For this purpose a two-dimensional array (matrix memory) is used, one dimension of which corresponds to the individual carriers 0 . . . $K_{max}$ of the OFDM-signal or carrier groups g formed by the combining of adjacent individual carriers k1 to k2 in order to save memory space. The number of memory cells for this dimension of the matrix memory is determined by the number of columns of the display being used, for example 320.

The other dimension of the matrix memory is reserved for the I- and Q-values. Here a separate memory cell is provided for each possible state of I and Q within the state diagram of the type of modulation being used, thus in the case of an 8-bit-coding of the I- and Q-values $2^8=256$ memory cells are provided for this dimension of the matrix memory. The relevant I- and Q-values are formed by complex demodulation of the individual carriers; they always relate to a single carrier k and to a single symbol within the OFDM signal, a symbol being determined by the totality of all the carriers at the time t.

The demodulated IQ-values are entered into this matrix memory having, for example, 256 row addresses and 320 column addresses.

At the start the matrix memory is initialized once with zeros.

Within a current symbol the following steps are performed:

Step 1:
For the first carrier k0 the associated I- and Q-values I0 and Q0 are determined and a predetermined hold value, for example a value 10, is entered into the memory cell addressed by the I0-component. This hold value determines the length of time for which a pixel is to be visible in the display. Then this hold value is likewise entered in the row address corresponding to the Q0-component.

Step 2:
Then step 1 is repeated for the next carrier and in the associated column address k1 the corresponding hold value is again entered in the row addresses corresponding to the relevant I1- and Q1- values of the carrier k1.

Step 3:
Steps 1 and 2 are repeated until all the carriers have been analyzed in the selected interval, whose limits can be arbitrarily selected by the user, or the entire symbol has been analyzed.

Step 4:
In this way a predetermined adjustable number of symbols are input into the memory and after the elapse of a predetermined acquisition time the individual columns of the matrix memory are read-out for the graphic display. Entries into the display device are made by requesting the content of all the components of the memory. If the content differs from zero, the corresponding pixel is set and the content of this memory cell is decremented by one.

The entry of a hold value under the relevant row address in the associated memory cells has the advantage that the screen display is constantly updated since new I- and Q-values are always processed in each cycle. The screen thus has a dynamic response, even if a single I/Q-value remains static on the screen over an arbitrary number of refresh cycles. If, in the illustrated example, the hold value 10 is selected, when process step 4 has been executed ten times the content of the memory cell becomes zero, thereby indicating that this I/Q-value has not occurred in the past ten refresh cycles.

In the event that individual carriers are combined to form a carrier group, the above described process steps are repeated for all the carriers of a group until all the carriers of a group are analyzed. Then the memory is addressed for the next carrier group.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A process for metrological analysis of multicarrier signals, wherein I- and/or Q-components acquired by demodulation are integrated over a plurality of values and are graphically displayed on a screen of a display device for each individual carrier or combined carrier group of the multicarrier signal in that the individual carriers or carrier groups are plotted one beside another on a horizontal axis of a diagram and the I- and/or Q-components associated with these carriers or carrier groups are in each case plotted along a vertical line.

2. The process according to claim 1, wherein the I- and Q-components associated with each individual carrier or carrier group are projected onto a single vertical line so that the I- and Q-components for all the carriers occur in a horizontal line of the diagram and faulty I- or Q-values appear as vertical lines or entirely absent I/Q-values appear as gaps in the horizontal lines.

3. The process according to claim 1, wherein in each case only a portion of the total frequency band occupied by the multicarrier system is displayed on the screen.

4. The process according to claim 1, wherein the integration and line projection of the I- and Q-values of the individual symbols, acquired by complex demodulation of the individual carriers, take place in a matrix memory which in one of its dimensions has as many row addresses as I- and Q-values are provided for the coding used, and in its other dimension has as many column addresses as individual carriers or carrier groups combined from adjacent carriers are provided, and wherein, consecutively for each carrier or each carrier group, a hold value is in each case entered in the row addresses, corresponding to the respective I- and Q-values, of the associated column addresses, and following the analysis of a predetermined number of symbols, the content of the matrix memory is read out for each column address for the graphic display on the display device.

5. The process according to claim 4, wherein following the reading out of the matrix memory, the content of all the addresses of the matrix memory is decremented by 1.

* * * * *